(12) United States Patent
Serb et al.

(10) Patent No.: US 11,669,721 B2
(45) Date of Patent: Jun. 6, 2023

(54) TUNABLE CMOS CIRCUIT, TEMPLATE MATCHING MODULE, NEURAL SPIKE RECORDING SYSTEM, AND FUZZY LOGIC GATE

(71) Applicant: UNIVERSITY OF SOUTHAMPTON, Southampton (GB)

(72) Inventors: Alexantrou Serb, Southampton (GB); Themistoklis Prodromakis, Southampton (GB)

(73) Assignee: UNIVERSITY OF SOUTHAMPTON, Southampton (GB)

( * ) Notice: Subject to any disclaimer, the term of this patent is extended or adjusted under 35 U.S.C. 154(b) by 676 days.

(21) Appl. No.: 16/617,377

(22) PCT Filed: May 29, 2018

(86) PCT No.: PCT/GB2018/051452
§ 371 (c)(1),
(2) Date: Nov. 26, 2019

(87) PCT Pub. No.: WO2018/215804
PCT Pub. Date: Nov. 29, 2018

(65) Prior Publication Data
US 2021/0004669 A1 Jan. 7, 2021

(30) Foreign Application Priority Data
May 26, 2017 (GB) ...................................... 1708512

(51) Int. Cl.
*G06N 3/065* (2023.01)
*G06N 3/049* (2023.01)
(Continued)

(52) U.S. Cl.
CPC ............. *G06N 3/065* (2023.01); *G06N 3/049* (2013.01); *G11C 11/413* (2013.01); *G11C 11/54* (2013.01); *H03K 19/20* (2013.01)

(58) Field of Classification Search
CPC ...... G06N 3/0635; G06N 3/049; G06N 7/023; G06N 7/043; G11C 11/413; G11C 11/05;
(Continued)

(56) References Cited

U.S. PATENT DOCUMENTS 5,519,812 A  5/1996 Ishihara
5,942,912 A  8/1999 Thewes et al.
(Continued)

FOREIGN PATENT DOCUMENTS

GB  2313968 A  12/1997
GB  2548081 A  9/2017
(Continued)

OTHER PUBLICATIONS

I. H. Stevenson and K. P. Kording, "How advances in neural recording affect data analysis." Nature neurosc., vol. 14, No. 2, pp. 139-142, 2011.
(Continued)

*Primary Examiner* — Sung S Ahn
(74) *Attorney, Agent, or Firm* — Volpe Koenig

(57) ABSTRACT

A tunable CMOS circuit comprising a CMOS element and a tunable load. The CMOS element is configured to receive in an analogue input signal. The tunable load is connected to the CMOS element and configured to set a switch point of the CMOS element. The CMOS element is configured to output an output current that is largest when the analogue input signal is equal to the switch point. The combination of a CMOS element with a tunable load may also provide a hardware implementation of fuzzy logic. A fuzzy logic gate comprises an input node, a CMOS logic gate including a
(Continued)

tunable load, and an output node. The input node is configured to receive an analogue input signal. The CMOS logic gate is connected to the input node. The tunable load is provided on a current path connected to the output node. The output node is configured to output an analogue output signal.

11 Claims, 7 Drawing Sheets

(51) Int. Cl.
    *G11C 11/413*    (2006.01)
    *G11C 11/54*    (2006.01)
    *H03K 19/20*    (2006.01)

(58) Field of Classification Search
CPC . G11C 13/0007; G11C 15/046; G11C 27/005; H03K 19/20; H03K 5/249
See application file for complete search history.

(56) References Cited

U.S. PATENT DOCUMENTS

| | | | |
|---|---|---|---|
| 2007/0146012 A1 | 6/2007 | Murphy et al. | |
| 2009/0243653 A1 | 10/2009 | Inokuchi et al. | |
| 2011/0106742 A1 | 5/2011 | Pino | |
| 2012/0011088 A1* | 1/2012 | Aparin | G06N 3/06 706/33 |
| 2012/0217995 A1* | 8/2012 | Pino | H03K 19/173 326/38 |
| 2014/0078809 A1 | 3/2014 | Katoh | |
| 2016/0379695 A1 | 12/2016 | Kulkarni et al. | |

FOREIGN PATENT DOCUMENTS

| | | |
|---|---|---|
| JP | H06223210 A | 8/1994 |
| WO | 2016175742 A1 | 3/2016 |
| WO | 2017161312 A1 | 9/2017 |

OTHER PUBLICATIONS

E. M. Maynard, C. T. Nordhausen, and R. A. Normann, "The Utah intracortical electrode array: A recording structure for potential brain-computer interfaces," Electroencephalography and Clinical Neurophysiology, vol. 102, No. 3, pp. 228-239, 1997.
D. Y. Barsakcioglu et al., "An Analogue Front-End Model for Developing Neural Spike Sorting Systems," IEEE Transactions on Biomedical Circuits and Systems, vol. 8, No. 2, pp. 216-227, Apr. 2014.
A. Rodriguez-Perez et al., "A low-power programmable neural spike detection channel with embedded calibration and data compression," in IEEE Transactions on Biomedical Circuits and Systems, vol. 6, No. 2, Apr. 2012, pp. 87-100.
S. E. Paraskevopoulou and T. G. Constandinou, "A sub-1 Wneural spike-peak detection and spike-count rate encoding circuit," in 2011 IEEE Biomedical Circuits and Systems Conference (BioCAS). IEEE, Nov. 2011, pp. 29-32.
a. Berenyi et al., "Large-scale, high-density (up to512 channels) recording of local circuits in behaving animals." Journal of neurophysiology, vol. 111, No. 5, pp. 1132-1149, Mar. 2014.
R. Q. Quiroga, Z. Nadasdy, andY. Ben-Shaul, "Unsupervised Spike Detection and Sorting with Wavelets and Superparamagnetic Clustering," Neural Computation, vol. 16, No. 8, pp. 1661-1687, Aug. 2004.
S. Gibson et al., "An efficiency comparison of analog and digital spike detection," in 2009 4th International IEEE/EMBS Conference on Neural Engineering. IEEE, Apr. 2009, pp. 423-428.
M. S. Lewicki, "A review of methods for spike sorting: the detection and classification of neural action potentials", Jul. 2009.
J. Navajas et al., "Minimum requirements for accurate and efficient real-time on chip spike sorting, Journal of Neuroscience Methods", vol. 230, pp. 51-64, 2014.
M. Chae et al., "A128-channel 6mWwireless neural recording IC with on-the-fly spike sorting and UWB Transmitter," in Digest of Technical Papers—IEEE International Solid-State Circuits Conference, vol. 51. IEEE, 2008, pp. 146-603.
Tomochika Harada et al:, "A Content-Addressable Memory Using "Switched Diffusion Analog Memory with Feedback Circuit"", Analog Integrated Circuits and Signal Processing, Dec. 1, 2000, p. 337.
Michael S Lewicki et al:, "Topical Review; A review of methods for spike sorting: the detection and classification of neural action potentials", Network: Computation in Neural Systems, IOP Publishing, Bristol, GB, vol. 9, No. 4, Nov. 1, 1998, pp. R53-R78.
Serb Alexander et al: "A memristor-CMOS hybrid architecture concept for on-line template matching", 2017 IEEE International Symposium On Circuits and Systems (ISCAS), IEEE, May 28, 2017, pp. 1-4.
Isha Gupta et al: "Spike sorting using non-volatile metal-oxide memristors", Jul. 27, 2017, https://arxiv.org/ftp/arxiv/papers/1707/1707.08772.pdf, p. 2; figure 3.
Serb Alexander et al: "Seamlessly fused digital-analogue reconfigurable computing using memristors", Nature Communications, vol. 9, No. 1, Jun. 4, 2018.
Serb Alexantrou et al: "Charge-based computing with analogue reconfigurable gates", Sep. 13, 2017, pp. 1-22, https://arxiv.org/ftp/arxiv/papers/1707/1709.04184.pdf.
Chan William et al: "Spike Timing Dependant Plasticity with Memristive Synapse in Neuromorphic Systems", WCCI 2012 IEEE World Congress on Computational Intelligence, Jun. 10-15, 2012—Brisbane, Australia.

* cited by examiner

TUNABLE CMOS CIRCUIT, TEMPLATE MATCHING MODULE, NEURAL SPIKE RECORDING SYSTEM, AND FUZZY LOGIC GATE

The present invention relates to a tunable CMOS circuit, a template matching module for determining a match between an analogue neural spike signal and a programmable template, a neural spike recording system for recording neuronal activity in-vivo, and a fuzzy logic gate.

A key component of the global effort to understand the functioning of the human brain pertains to the development of brain-machine interfaces capable of recording neuronal activity in-vivo; itself a whole research area progressing under its own version of Moore's law[1]. Typically, large-scale neural activity monitoring is achieved through implantable systems that consist of three broad blocks: a) an electrode array[2], b) an Analogue Front-End (AFE) block usually consisting of amplification, filtering and digitisation[3], c) a signal processing block (Back-End) that may either concentrate on performing single-neuron activity detection (spike detection[4] or sorting[5]) or include Local Field Potential (LFP) extraction[6] and d) telemetry for transmitting the extracted data to the external receiver.

Single-neuron activity detection in the back-end block is currently achieved through a multitude of approaches such as threshold detection[7], non-linear energy operator[8], template matching[9] and others; each offering a different solution on the implementation complexity vs. accuracy trade-off space[10]. What all these methods share in common, however, is the objective of compressing a high data rate voltage-time series signal arriving from the AFE block into a low data-rate/high-information output signal encoding the timing of neuronal action potentials (spikes) only, while suppressing noise.

At the implementation level, on-chip spike detectors and sorters have to: a) operate using minimal area and power budgets, b) achieve maximum data compression to ease the power budget of the telemetry block and c) avoid placing excessively area/power expensive signal preconditioning requirements on the AFE block. Existing architectures utilising fully digital[11] and mainly analogue[5] techniques use expensive operational amplifies and analogue multiplier blocks, and fundamentally perform spike detection (i.e. determination whether a spike has occurred) rather than spike sorting (i.e. determining the category ID of a spike that has occurred).

There is thus a need for devices that allow in-vivo categorization (sorting) of neural spikes in real time and under highly restrictive power and area budgets. There is also a need for a hardware implementation of fuzzy logic, or a device generally capable of mapping an input parameter to different membership functions.

It is an object of the invention to provide a real-time spike sorting system with low power dissipation and small area footprint. It is a further object of the invention to provide a hardware implementation of fuzzy logic.

According to an aspect of the invention, there is provided a tunable CMOS circuit. The tunable CMOS circuit comprises a CMOS element and a tunable load. The CMOS element receives an analogue input signal. The tunable load is connected to the CMOS element. The tunable load sets a switch point of the CMOS element. The CMOS element outputs an output current which is largest when the analogue input signal is equal to the switch point.

The tunable CMOS circuit is capable of determining whether an analogue input signal is equal to or matches a switch point that is pre-set or stored in the tunable CMOS circuit. The tunable load can be programmed to store or set a switch point value. When the analogue input signal is equal to this stored or pre-set switch point value, the tunable CMOS circuit outputs a maximum or highest or largest output current. When the analogue input signal is not equal to the switch point, the output current is less than the maximum output current. The tunable CMOS circuit thus allows determination of an exact match between the analogue input signal and the set switch point. Power dissipation is minimal if no match is determined. The simple structure of the tunable CMOS circuit ensures that its footprint remains small. The tunable CMOS circuit may thus be used as a fundamental building block with small footprint and low power dissipation in a template matching module to enable categorization of neural spikes.

In an embodiment, the tunable load comprises one or more memristors. A memristor may store the switch point value in an area-efficient manner, due to its back-end-of-line integrability. A memristor may form part of an integrated circuit with a CMOS element. The tunable CMOS circuit thus has a small area footprint, and can be easily produced on a large scale.

In an embodiment, a first CMOS stage and/or a second CMOS stage of the CMOS element comprises a CMOS inverter. The CMOS inverter is the smallest CMOS building block. The area footprint of the tunable CMOS circuit is thus small.

In an embodiment, the tunable load is connected in series with a first CMOS stage or a second CMOS stage of the CMOS element. This allows control of the maximum current flowing through the respective CMOS stage, to further reduce power dissipation of the tunable CMOS circuit. Such a configuration may also allow control of the sensitivity of the tunable CMOS circuit, by setting a range around the switch point within which a match is determined. The flexibility of the tunable CMOS circuit is thus enhanced.

According to an alternative aspect of the invention, there is provided a template matching module for determining a match between an analogue neural spike signal and a programmable template. The template matching module comprises a sampling element that samples the analogue neural spike signal at a plurality of discrete moments in time so as to create a plurality of signal samples. A template row stores a tunable template. The template row comprises a plurality of template pixels. Each of the plurality of template pixels comprises the tunable CMOS circuit. The template pixel stores a value or voltage value as a switch point of the tunable CMOS circuit. The template pixel receives a respective one of the plurality of signal samples as an analogue input signal applied to the tunable CMOS circuit. The template pixel determines whether the one of the plurality of signal samples matches the stored value, in that the tunable CMOS circuit outputs a maximum current when the analogue input signal equals the switch point. The template pixel outputs an output current. The output current is maximized when a signal sample matches a respective stored value. An output device integrates the output currents outputted by the plurality of template pixels. The sum of the output currents of the plurality of template pixels is maximized when each template pixel determines a match between the signal sample applied to it and its stored value. The sum of the output currents is maximized when the plurality of signal samples derived from the analogue input signal match the template stored in a template row. There is thus provided a template matching module that is made up of a plurality of tunable CMOS circuits, each demonstrating low power dissipation and a small area footprint. A neural spike signal applied to the template matching module can be matched to a template stored therein, so as to sort and categorize neural spike signals.

According to an alternative aspect of the invention, there is provided a neural spike recording system for recording neuronal activity in-vivo. The neural spike recording system comprises a neurological sensor. The neurological sensor measures neuronal activity and outputs a corresponding analogue electrical signal. Signal processing circuitry pre-processes the analogue electrical signal so as to create pre-processed neuronal data. The template matching module isolates a neural spike signal from the pre-processed neuronal data and determines whether the neural spike signal matches one of the stored templates. There is thus provided a neural spike recording system with low power dissipation and small area footprint, allowing spike sorting in real time and in-vivo.

According to an alternative aspect of the invention, there is provided a fuzzy logic gate. The fuzzy logic gate comprises an input node that receives an analogue input signal. A CMOS logic gate is connected to the input node. A tunable load is connected to the CMOS logic gate such that the tunable load is provided on a current path connected to an output node. The output node outputs an analogue output signal. Depending on the level of the analogue input signal, behaviour of the analogue output voltage is dominated either by the states of the CMOS logic gate or by the resistive states of the tunable load. By controlling the resistive states of the tunable load, the input/output mapping or fuzzy function of the fuzzy logic gate can be reconfigured. There is thus provided a highly flexible hardware implementation of fuzzy logic with low power dissipation and small area footprint.

The invention will be more clearly understood from the following description, given by way of example only, with reference to the accompanying drawings, in which:

FIG. 1 schematically depicts a neural spike recording system for processing data from a neurological event in accordance with an embodiment;

FIG. 2 schematically illustrates the general concept of template matching;

The same references are used for similar features throughout the drawings. The features shown in the figures are not necessarily to scale and the size or arrangements depicted are not limiting. It will be understood that the figures may include optional features which are not essential to any embodiments. Furthermore, not all of the features are depicted in each figure and the figures may only show a few of the components relevant for a describing a particular feature.

A major issue facing the field of recording neural activity in the brain is the enormous amount of generated data. This data consists of voltage-time series representing the overall electrical activity in the vicinity of each recording electrode in the system, each voltage-time series being much akin to an oscilloscope trace. However, the useful information embedded within that signal merely consists of the timings and unique category IDs (or shapes) of each action potential (spike). This is a much lower bandwidth signal. The present invention solves the problem of extracting this useful information out of the high-bandwidth raw signal, a process known as 'spike sorting' using components with a low power dissipation and a small area footprint.

Figure 1:
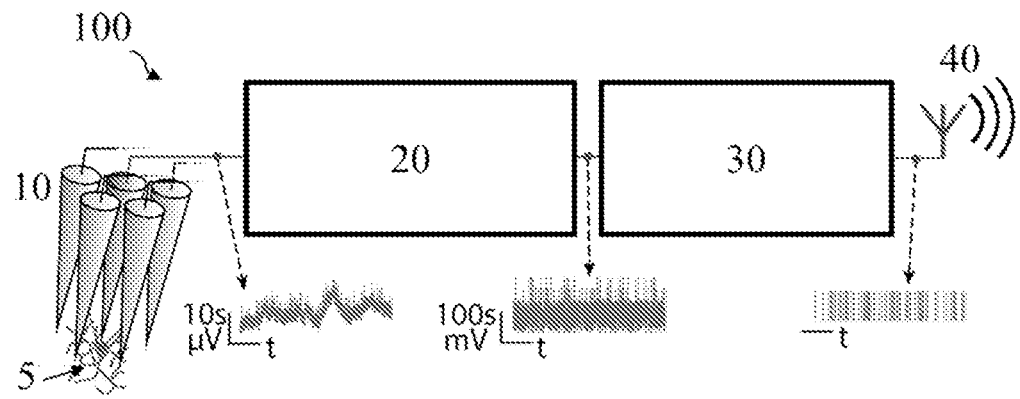

FIG. 1 depicts a single-unit neural activity monitoring system channel architecture as an example of a neural spike recording system 100 for recording neuronal activity. The system includes a neurological sensor 10 that may be used to take measurements of a neuron 5. The neurological sensor 10 may detect neurological events, such as firing of a neuron 5. Thus, the neurological sensor 10 may measure raw neuronal data based on a neural waveform at a particular location. A spike in the neural waveform during a neurological event may be caused by an action potential being generated by a neuron 5, which results in a sharp deviation from the baseline of the neural waveform. The neurological sensor 10 may pick up variations due to multiple neurons 5. The neural waveform thus indicates neurological events by spikes in the neural waveform relating to multiple neurons 5. Each neuron 5 may have a characteristic neural spike form, allowing different neurons 5 to be distinguished. The neurological sensor 10 outputs raw neuronal data as an electrical output which has a voltage, or as an analogue electrical signal. The output has a variation of voltage over time. The voltage of the output varies depending on the neural waveform, and spikes in the neural waveform lead to corresponding spikes in the voltage of the output. Thus there are large, sharp increases in the voltage of the output when a neurological event occurs. It is particularly beneficial to determine certain characteristics of these voltage spikes relating to the neurological event, such as the timings and unique category ID of the spikes. A unique category ID corresponds to a specific action potential activity of a specific neuron 5, which may be detected as a specific spike form or shape by the neurological sensor 10.

The output of the neurological sensor 10 may be sent to an analogue front end, or signal processing circuitry 20. The signal processing circuitry 20 pre-processes the raw neuronal data. The signal processing circuitry 20 may boost the voltage of the output from the neurological sensor 10 and apply filtering to the raw neuronal data. The pre-processed neuronal data may be provided to a template matching module 30. The pre-processed neuronal data may be provided or streamed to the template matching module 30 in real-time. The template matching module 30 may isolate neural spike signals from the pre-processed neuronal data, so as to create a succession or stream of neural spike signals. For each neural spike signal, the template matching module 30 determines whether the neural spike signal matches a template or template signal that is stored in the template matching module 30. The template matching module 30 may indicate when a match is determined. As such, the template matching module 30 may perform spike sorting on-line, as it may process a received neuronal data stream in real time. The template matching module 30 may store a plurality of different templates, each corresponding to a different characteristic neural spike that is attributable to a corresponding neuron. The template matching module 30 may thus categorize each of the stream of neural spike signals, so as to attribute a unique category ID to each different characteristic neural spike signal. An output stage 40 may store and/or transmit the timings and category IDs of each determined match. The output of the output stage 40 is thus a low bandwidth signal containing useful information extracted from the raw neuronal data. The output stage 40 may comprise a storage device, a telemetry and antenna module, or another communication device.

The neurological sensor 10 may be any sensor capable of detecting waveforms described above and capable of detecting events in the waveform. The neurological sensor 10 may comprise an electrode. The neurological sensor 10 may be used in various ways, for example, in vitro or in vivo. The neurological sensor 10 may store measurements. Alternatively, the measurements may be passed in real time (or with minor delay) to the signal processing circuitry 20 or may be stored in another device which can send the measurements to the signal processing circuitry 20 at a desired time. The neurological sensor 10 may be configured and used, as depicted in FIG. 1, to detect and measure neurological changes.

Figure 2:
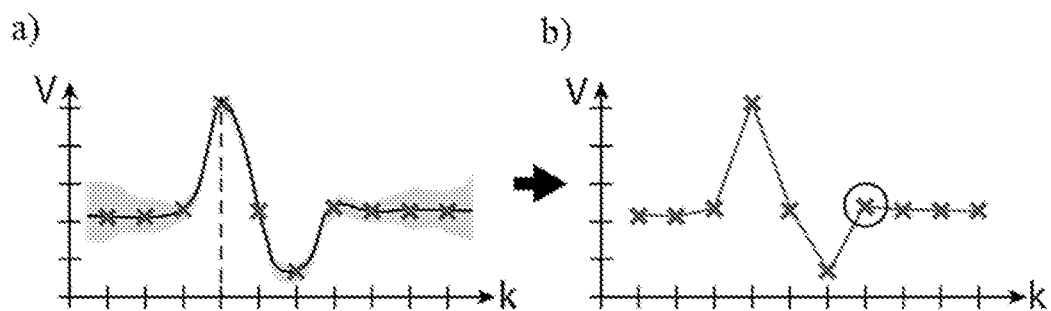

FIG. 2a shows an example of a neuronal spike signal measured by the neurological sensor 10 and isolated by the template matching module 30. The depicted spike form or shape corresponds to a unique spike category ID. Different neurological events of different neurons 5 are detected as neural spike signals with a different shape and category ID. For a comprehensive analysis of the measured neural waveform, it is necessary to distinguish between different neurological events, for example by determining the category ID of each detected neural spike signal. This may be achieved by template matching. FIG. 2 illustrates how a neural spike template signal may be constructed. Firstly, multiple neural spikes identified as originating from the same neuron 5 are aligned, for example peak aligned, to form an aggregate signal (grey shade). The average waveform is then extracted (black trace in FIG. 2a). The average waveform is then sampled at a plurality of discrete moments in time, to create a plurality of samples depicted by the crosses on the spike waveform. The template of FIG. 2b may then be built from the samples. To detect a match with a template, an analogue spike waveform is sampled at the same rate as the template to create a plurality of samples. Each sample is then compared to a corresponding template sample. When all samples match or substantially match their corresponding template sample, a match between the neural spike signal and the template signal is determined.

Figure 3:
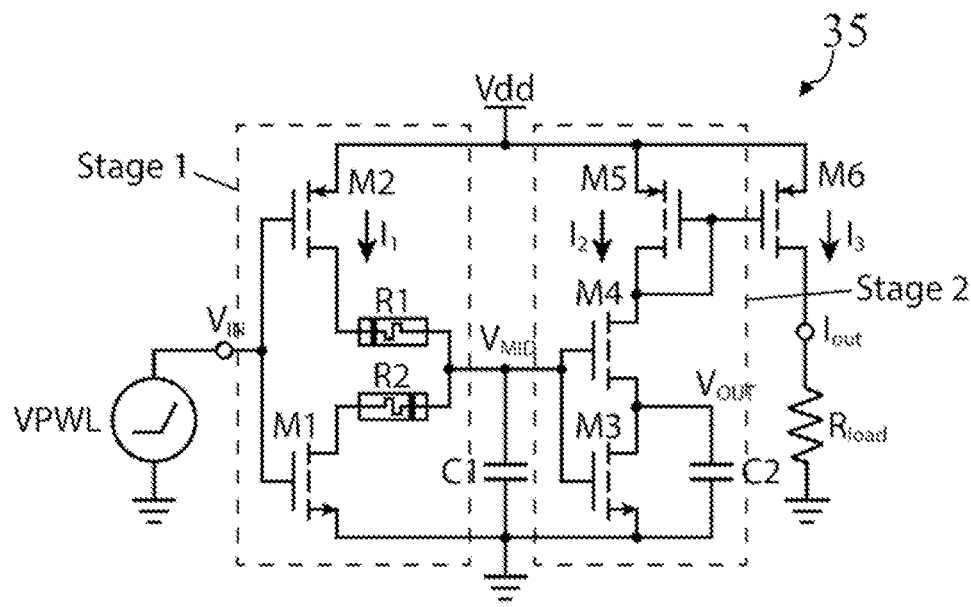
FIG. 3 depicts a tunable CMOS circuit operable as a template pixel or texel in accordance with an embodiment.

FIG. 3 depicts an example of the basic architecture of a template pixel, or texel 35. The texel 35 of FIG. 3 is an example of a tunable CMOS circuit 35. A texel 35 is the fundamental building block that stores a template sample or template sample voltage. A template sample voltage is stored as a switch point of the texel 35. The switch point has a single voltage value. A texel 35 is used to compare an input voltage to the stored template sample voltage, for example by comparing an analogue input signal to the switch point. The texel 35 may output a metric of the similarity or matching of the analogue input signal and the switch point, such that the texel 35 is a distancing circuit. The texel 35 shown in FIG. 3 includes a CMOS element that comprises a first CMOS stage M1/M2, a second CMOS stage M3/M4, and an output stage M5/M6. Overall, the CMOS element of the CMOS circuit consists of 6 transistors and 2 tunable loads. The first CMOS stage receives an analogue input signal $V_{in}$, such that the CMOS element received the analogue input signal $V_{in}$.

The first CMOS stage comprises a CMOS inverter M1/M2, consisting of an n-MOS transistor M1 and a p-MOS transistor M2. M1 and M2 are connected in series. Two memristors R1 and R2 are connected between M1 and M2, so as to form a memristor-based potential divider. R1 and R2 are thus connected to the first CMOS stage, and as such are connected to the CMOS element. R1 and R2 are connected in series to the first CMOS stage. By changing the resistive states of the memristors, i.e. by changing the resistance of each memristor, the switch point of the CMOS inverter M1/M2 can be shifted so as to set the switch point of the CMOS element. The memristors thus set a switch point of the texel 35 or tunable CMOS circuit 35. The memristors are one example of a tunable load. Various devices may be considered a tunable load. For example, RRAM, FeRAM, STTRAM, PCMRAM and others are different forms or technological implementations of components exhibiting resistive switching. Alternatively, the tunable load may be a non-memristor tunable resistive load, such as a floating gate transistor. The skilled person would understand that further alternatively any other tunable resistor may be used in place of the memristor of FIG. 3. The output of the first CMOS stage is connected to the input of a second CMOS stage. The output of the first CMOS stage is therefore a midpoint signal $V_{mid}$ of the tunable CMOS circuit.

The second stage of FIG. 3 includes another CMOS inverter M3/M4. The CMOS inverter M3/M4 consists of an n-MOS transistor M3 and a p-MOS transistor M4. M3 and M4 are connected in series. The CMOS inverter M3/M4 is fed through a mirror supply M5/M6. The mirror supply may be a current mirror. The mirror supply M5/M6 is an example of the output stage. Transistor M6 mirrors the current that flows through transistor M5. The output of the texel is thus an analogue output current $I_{out}$. This output current $I_{out}$ is equal to or proportional to the current draw of the second CMOS stage M3/M4. The current draw of the second CMOS stage M3/M4 is maximised when the voltage at node 'MID' $V_{mid}$ is such that both M3 and M4 are simultaneously maximally open. This will occur at a predetermined fixed voltage value $V_{pk}$. The voltage value $V_{pk}$ is determined by the sizing of M3 and M4. To a weaker degree, the voltage value $V_{pk}$ may also be dependent on the sizing of M5. The resistive state of the tunable load can be programmed to set a switch point of the texel 35, such that the input voltage $V_{in}$ that causes $V_{mid}$ to equal the voltage value $V_{pk}$, and consequently $I_{out}$ to reach its maximum, can be controlled. Put another way, the tunable load sets a voltage value (or switch point), such that the first CMOS stage outputs a midpoint signal equal to the value $V_{pk}$ when an analogue input signal with value equal to the switch point is applied at the first CMOS stage. At the switch point the midpoint signal $V_{mid}$ has the value $V_{pk}$, such that the current drawn by the second CMOS stage is largest. As the mirror supply M5/M6 mirrors the current drawn by the second CMOS stage, the output current is also maximised when the analogue input signal is equal to the switch point.

In FIG. 3, the memristors are thus used to set a switch point of the first CMOS stage, by setting a function that maps the analogue input signal $V_{in}$ to the output voltage of the first CMOS stage (which corresponds to the midpoint signal $V_{mid}$). When $V_{in}$ is equal to the switch point, $V_{mid}$ has the value $V_{pk}$, and $I_{out}$ is maximised. The skilled person would understand that the same effect can be achieved using different memristor configurations, such as in the texel designs of FIGS. 8 to 12 that are described in more detail below. For example, the memristors may be connected to the second CMOS stage, to allow control of the voltage value $V_{pk}$ at which M3 and M4 are simultaneously maximally open and $I_{out}$ is maximised. Further alternatively, the memristors may be used to set a bulk biasing point of the first CMOS stage, or may be connected in series of the source terminals of the transistors M1 and M2 of the first CMOS stage.

Figure 4:
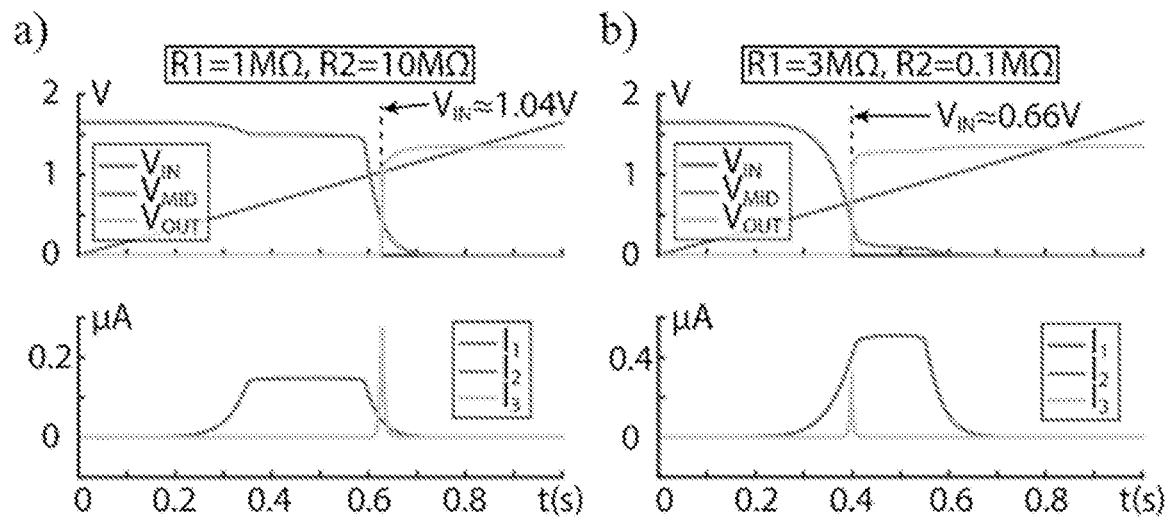
FIG. 4 shows examples of the operation of the tunable CMOS circuit of FIG. 3.

An example of the operation of the texel 35 of FIG. 3 is illustrated by the two transfer characteristics of FIG. 4. In both transfer characteristics, $I_1$ is the current flowing through the first CMOS stage, $I_2$ is the current flowing through the second CMOS stage, and $I_3$ is the current flowing through the output stage (and thus corresponds to $I_{out}$). As the mirror supply M5/M6 mirrors current $I_2$ to give rise to $I_3$, $I_2$ and $I_3$ are equal in FIG. 4. Each transfer characteristic is based on a different configuration of memristor values. In FIG. 4a, R1 is set to 1 MΩ and R2 is set to 10 MΩ. The tunable load R1/R2 sets the switch point to 1.04V. $I_{out}$ (or $I_3$) spikes (or is largest, reaches a maximum) when the analogue input signal is equal to the switch point, i.e. when $V_{in}$=1.04V. In FIG. 4b, R1 is set to 3 MΩ and R2 is set to 0.1 MΩ. The tunable load R1/R2 sets the switch point to 0.66V. $I_{out}$ or $I_3$ therefore spikes when $V_{in}$=0.66V. The fundamental operation mechanism is the same in both memristor configurations. M1, M2, R1 and R2 of FIG. 3 form a four-component potential divider, where for each value of $V_{in}$ every component shows a fixed static resistance. Sweeping $V_{in}$ reveals its effect on the balance between these resistances: in both FIGS. 4a and 4b the current $I_1$ in the first CMOS stage follows a table-hill form. At the 'table-top' region of the curve both transistors M1 and M2 are simultaneously maximally open. Therefore, the dominant resistance is this region is the series combination of the two memristors R1 and R2. In the table-top region, the midpoint signal $V_{mid}$ is largely constant and determined by the memristor potential divider R1/R2 and proportional to the ratio R2/(R1+R2). At the 'foothill' regions the gate-source voltage $V_{gs}$ of either M1 or M2 has begun to sink below threshold, letting it dominate the divider. Provided the table-top voltage is not equal to the fixed value $V_{pk}$ (which is fixed at 0.42V in both configurations), $V_{mid}$ will become equal to $V_{pk}$ (such that $I_3$ or $I_{out}$ is maximised) at one of the foot regions. The sum of R1+R2 and its relation to the $V_{in}$-dependent static resistances of M1 and M2 defines the range of input voltages for which the memristors dominate the divider, and for which therefore $V_{mid}$ cannot reach the value $V_{pk}$. Meanwhile the ratio R2/(R1+R2) determines the table-top voltage and thus indirectly the shape of the foothill regions, and consequently the point at which $V_{mid}$ has the value $V_{pk}$. The texel 35 can also be operated at the table-top region. Keeping the ratio of resistances between R1 and R2 such that the table-top voltage equals $V_{pk}$ will allow $I_{out}$ to maximise for a range of input voltages $V_{in}$ determined by the sum R1+R2. This can be useful when the entire length of the pattern need not be defined. Any texel may be tuned to a broad range of input signals (always on) by setting the table-top voltage equal to the value $V_{pk}$ and maximising R1+R2. Finally, the second stage detects whether the output voltage of the first stage is close to its preferred $V_{pk}$ and outputs a corresponding current in response. In both example cases $I_{out}$ is maximised at $V_{mid}$=0.42V (max. $I_{out}$=250 nA).

Figure 5:
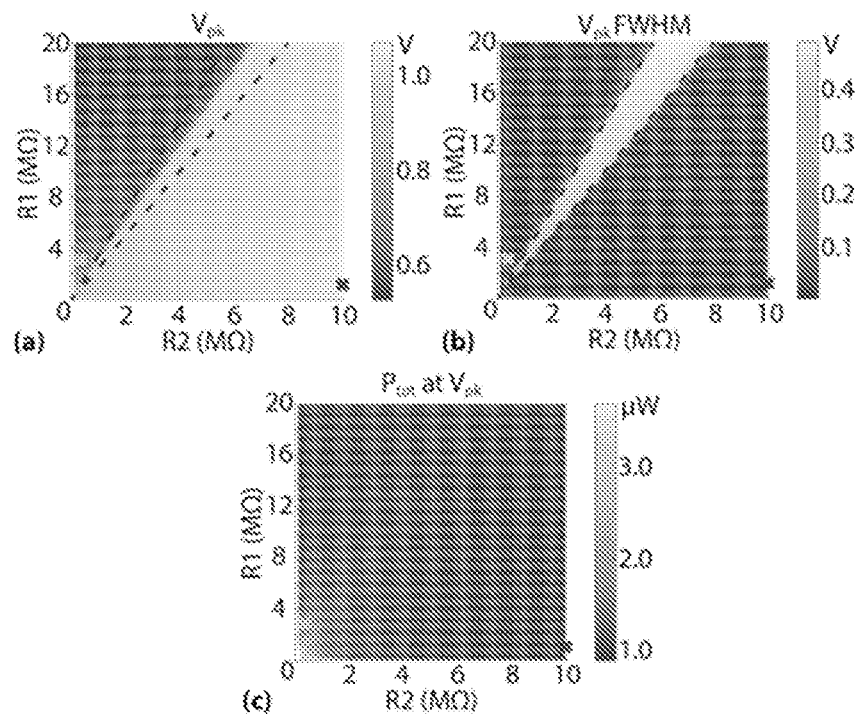
FIG. 5 shows the dependence of key texel performance indicators on the resistive states of the tunable load.

The capabilities of the tunable CMOS circuit 35 of FIG. 3 are further apparent from FIG. 5, which shows simulations of how key texel performance indicators are affected by setting different resistive state values for R1 and R2. For these simulations TSMC 0.35 μm technology devices have been used, capacitors C1 and C2 are set to 1 pF, and the power supply voltage $V_{dd}$=1.65V. FIG. 5a shows the range of input voltages $V_{in}$ at which the output current $I_{out}$ is maximised, i.e. the range of switch points that can be set by the memristors. As shown, the switch point can be set within a range from 0.55V to 1.05V. This is broadly similar to the range defined by the power supply minus the thresholds of M1 and M2. Memristor resistive states within 0.1 to 5 MΩ suffice to cover a large part of that range. FIG. 5b shows the breadth of the voltage range for which the output current exceeds half the maximum output current, i.e. the full width at half maximum (FWHM) of the output current plot. It is apparent that most of this input voltage range can be covered at a controllable degree of sensitivity. In FIG. 5b, the FWHM is, for most resistive state values, about 10-20 mV. The FWHM may be controlled by shifting the resistive states of the memristors, so as to control the sensitivity of the texel. The FWHM may be controlled to values in the range from 10 mV to 50 mV, preferably from 10 mV to 25 mV, and further preferably from 10 mV to 20 mV. The range of analogue input signal voltages about the switch point for which a match is determined can be controlled. FIG. 5c shows the maximum overall texel steady-state power dissipation when operating at the switch point. As expected, the power dissipated at the switch point increases when both memristors drop in resistive state, but remains at <1.5 μW for the majority of the design range. It must be stressed that the power dissipation when the texel 35 does not operate at the switch point will be generally much lower. FIG. 5 illustrates the flexibility and tunability of the characteristics of the tunable CMOS circuit or texel 35 of FIG. 3. The texel 35 is operable to match an analogue input voltage to one of a wide range of possible switch points with a high degree of sensitivity, while maintaining a low power dissipation.

The tunable CMOS circuit 35 may be used by first programming the tunable load to set a switch point of the tunable CMOS circuit 35. Then, an analogue input signal may be applied to the tunable CMOS circuit 35. The output current of the tunable CMOS circuit 35 may then be measured. This output current is largest or maximised when the analogue input signal is equal to the pre-set switch point of the tunable CMOS circuit 35.

As discussed above, the texel 35 of FIG. 3 allows matching of an analogue input signal to a switch point or single voltage value stored in the texel 35. When an analogue input signal equals the switch point, the output current of the texel 35 is maximised. In order to implement the template matching of FIG. 2, each of a plurality of neural spike samples may be compared to a respective switch point of one of a plurality of texels 35. The system architecture of an exemplary template matching module 30 implementing such template matching is schematically depicted in FIG. 6.

Figure 6:
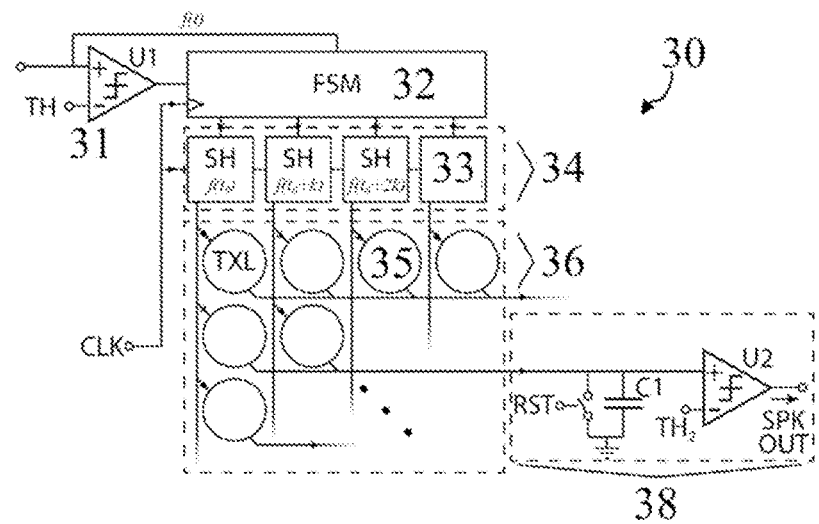
FIG. 6 depicts a template matching circuit for determining a match between an analogue neural spike signal and a programmable template.
Figure 7:
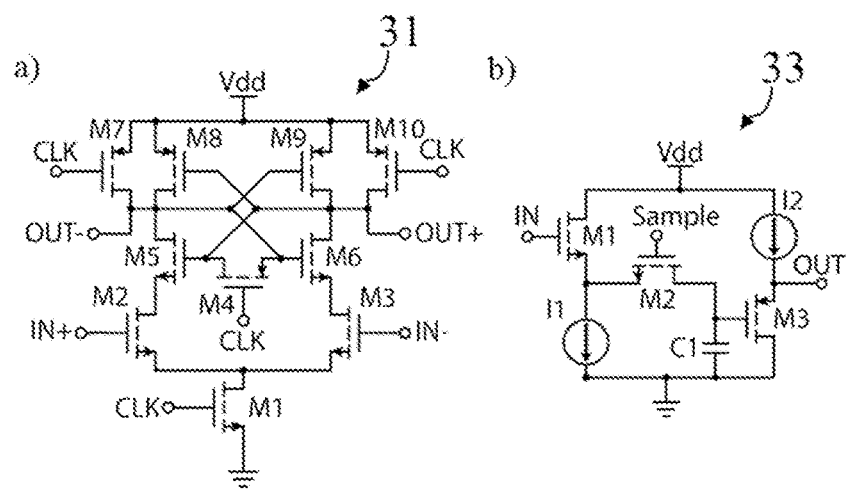
FIG. 7 shows examples of the supporting circuitry modules of the template matching circuit of FIG. 6.

The template matching module 30 of FIG. 6 comprises supporting circuitry modules (31, 32, 34) and a plurality of template rows 36. The supporting circuitry modules include a comparator 31, a final state machine (FSM) 32 and a sample and hold (SH) bank 34. The comparator 31 may be implemented using a standard low power clocked latch design, as shown in FIG. 7a, or a continuous time operational amplifier. In the former case power will be saved, but in the latter case the expected reduction in sampling jitter may improve performance accuracy. The comparator 31 may alternatively be implemented as a texel 35 that indicates whether an analogue input signal is above or below a spike detection threshold TH1. The comparator 31 may isolate a neural spike signal, or a stream of neural spike signals, from neuronal data. The comparator 31 is an example of a spike isolation module. Once a spike detection threshold TH1 of the comparator is exceeded, the FSM 32 is activated. The FSM 32 can be implemented either as a counter or as a linear one-hot register, in both cases feeding a multiplexer. The multiplexer may route a succession of input signal samples to the SH bank 34. Once triggered, the FSM does not re-trigger until the SH bank 34 is full. The SH bank 34 consists of a plurality of SH circuits 33. Each SH circuit 33 is implementable using a switch capacitor circuit topology carrying out correlated double sampling (CDS) in CMOS imagers. Alternatively, the input to each SH circuit 33 may be single-ended. FIG. 7b shows a half-CDS circuit that may be used in each SH circuit 33. The FSM 32 and SH bank 34 are an example of a sampling element that samples an analogue input signal at a plurality of discrete moments in time to create a plurality of signal samples. The analogue input signal may be sampled at a rate of 7 to 28 kHz.

Each of the plurality of template rows 36 includes a plurality of texels 35. Each texel 35 of a template row 36 stores a template sample (or switch point), such that each template row 36 stores a template. For example, with reference to FIG. 2b, each texel 35 may store a template sample corresponding to one of the crosses of FIG. 2b. As the template sample (or switch point) of each texel 35 can be changed by programming a tunable load of the texel 35, the template stored by a template row 36 is tunable. Each template row 36 may store a different template. Each texel 35 of each template row 36 is connected in parallel to a respective SH circuit 33 of the SH bank 34. The template rows 36 are connected in parallel to each other, and in parallel to the SH bank 34. Each SH circuit 33 of the SH bank 34 may thus feed a signal sample to a respective texel 35 of each template row 36. The closer the match between the signal sample applied to a texel 35 and the template sample stored in the texel 35, the higher is the output current of a texel 35. Preferably, each template row 36 comprises 10-24 texels 35, to achieve an adequate sampling resolution and ensure that different neural spikes can be distinguished. The template matching module 30 preferable includes 4 to 5 template rows 36, each storing a different template. This allows 4 or 5 different neural spike signals attributable to 4 or 5 different neurons to be distinguished and categorized or identified. However, the skilled person would understand that the template matching module 30 may comprise only one template row 36, such that one specific neural spike signal can be identified.

Each of the plurality of template rows 36 includes an output device 38. The output device of a template row 36 integrates or sums the output currents of each texel 35 of the template row 36. The overall output current is maximised when the signal sample applied to each texel 35 of a template row 36 matches or is equal to the template sample (or switch point) stored in the texel 35. The output device 38 may indicate when the integral or sum of the output currents of each of the texels 35 of a template row 36 exceeds a threshold TH2, so as to indicate a match of an analogue input signal with a template 36. By tuning the value of threshold TH2, the sensitivity of the template row 36 of the template matching module 30 may thus be controlled. A match may be determined when the sum of the output currents of the plurality of texels 35 of a template row 36 is, for example, at least 50% of its maximum value, or preferably close (e.g. at least 90% or at least 99%) to its maximum value. Tuning the value of threshold TH2 allows control of this sensitivity. The output device 38 may include a capacitor. The output currents of all texels 35 of a template row 36 may be integrated on the capacitor. The charge on the capacitor may be reset periodically, such that the output currents are integrated on the capacitor only for a suitable amount of time. The capacitor may be reset at the sampling rate of the SH circuits 33, which may be around 7 to 28 kHz. The reset signal that discharges the capacitor may be globally shared. If the current integrated on the capacitor exceeds a spike recognition threshold TH2, a spike corresponding to the template of the respective template row 36 may be registered. This small-bandwidth/high-information signal can then be stored or communicated away from the template matching module 30. Alternatively, the output device may include a load resistor instead of a capacitor. The output currents of each texel 35 of a template row 36 may simultaneously flow through the load resistor, such that the potential across the load resistor provides an indication of the output currents. If the potential exceeds a pre-determined spike recognition threshold TH2, a spike may be recorded.

The present invention thus provides a device that allows in-vivo categorization (sorting) of neural spikes in real time and under highly restrictive power and area budgets. To provide an example of the power and area requirements of the template matching module 30, a template matching module 30 with three template rows 36 and ten texels 35 per template row 36 is considered in the following. It is assumed that an analogue input signal applied at the template matching module 30 matches one of the three stored templates, such that the output current of each of the ten texels 35 of the template row 36 storing the matched template is maximised. Each texel 35 operating at its switch point dissipates 1.5 µW of power, as described above. As such, the matching template row 36 dissipates 15 µW of power. It is further assumed that each of the ten texels 35 of each of the other two (non-matching) template rows 36 operates at the table-top current of FIG. 2b (which is equal to 0.5 A). The two non-matching template rows 36 together may thus consume approximately 16.5 µW (2·10·0.5 A·1.65V). The total power consumption of the exemplary template matching circuit 30 is thus 31.5 µW. If the system operates at 12 kHz, this comparison can be performed at most at a sampling rate of 1.2 kHz per template row 36 comprising ten texels 35. If it is further assumed that a texel assessment can be completed within 1/12 kHz≈83 µs, then the maximum channel power dissipation for an input signal consisting of a constant stream of back-to-back matchable spikes drops to 3.15 µW. With regard to the footprint of the template matching circuit 30, transistors M4, M5 and M6 occupying a W·L of 120×1 µm² each comprise the majority of the total nominal transistor W·L of 415.5 µm² footprint (500 µm² including 20% overhead). The above calculations illustrate rough expected power/area overheads only, and may be further improved by optimizing transistor sizing and the power supply voltage. The currents assumed in the above calculations are conservative estimates. The rough estimates show that the template matching module 30 according to the present invention may meet the strict power and area specifications to allow in-vivo and real time spike sorting.

The present invention may feature its own set of design considerations. First, the circuitry may be affected through its input signal range requirements (usable range of ≈0.5V), the most notable feature being the difference between input range and power supply. This may be potentially addressed using lower threshold transistors in suitable CMOS technologies, in which case the supply voltage may be able to drop without loss of performance. Another important consideration is noise. This may be mitigated by the capacitor in the SH circuit 33 of FIG. 7b and by the integrator-based read-out approach of the output device 38 of FIG. 6. Next, memristors are non-linear I-V elements which may render control over the precise distribution of voltage in the first stage of each texel 35 challenging. This can be mitigated by using a 1/chip (or few/chip), normally-off programmer that programs the texel array one template row 36 at a time, accessing the memristors in each texel 35 individually and manipulating them until the pattern current is maximised at the correct input. Simultaneously, the architecture inherently allows control over the tuning sharpness for each template through adjustment of TH2 of the output stage of each template row 36 of the template matching module 30. The template matching module 30 shows great promise in terms of down-scaling both in area (6 transistors/texel+back-end elements) and power and obviates the need for an analogue-to-digital converter (ADC) anywhere in the system. In conclusion, there is provided a memristor-CMOS hybrid on-line template matcher with a view towards integrated implementation.

Figure 8:
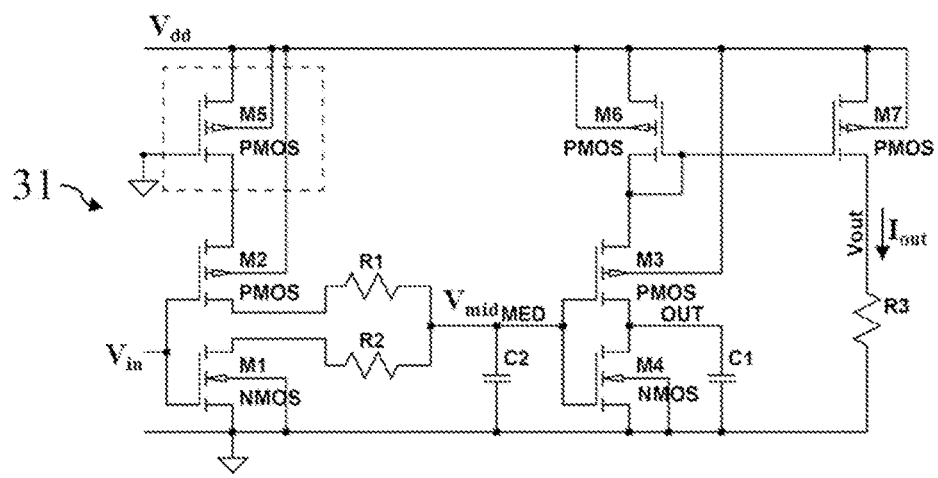
FIG. 8 shows an alternative embodiment of a texel including an input range setter.
Figure 9:
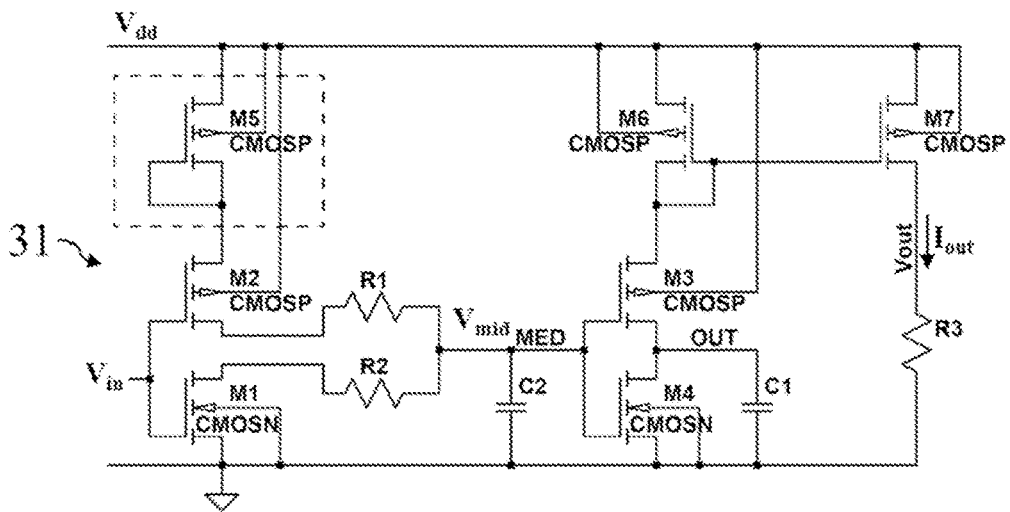
FIG. 9 shows another alternative embodiment of a texel including a diode-connected input range setter.

FIGS. 8 to 12 depict alternative texel 35 designs that may be used in the template matching module 30. The texel 35 design of FIGS. 8 and 9 include an additional transistor (range-setting transistor) (M5 in FIGS. 8 and 9), which is an example of an input range setter. The additional transistor is connected to the first CMOS stage. The additional transistor is used to match an input signal range of the first CMOS stage to an input signal range of the second CMOS stage. The gate terminal of the additional transistor may be grounded, as shown in FIG. 8. Alternatively, the additional transistor may be diode connected, i.e. the gate terminal of the additional transistor may be connected to its drain terminal, as shown in FIG. 9. The diode connected additional transistor of FIG. 9 may be used to achieve a higher voltage drop than the gate grounded transistor of FIG. 8.

Figure 10:
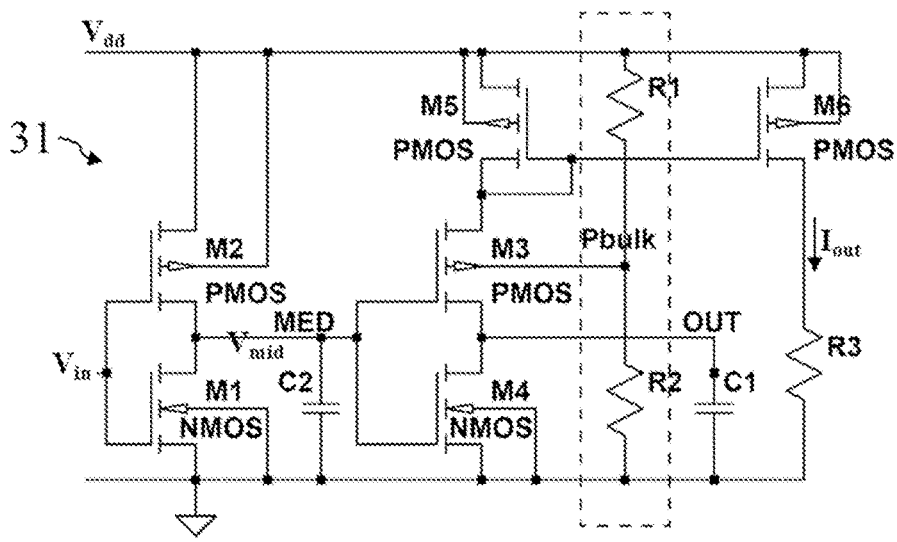
FIG. 10 shows another alternative embodiment of a texel in which a switch point of a second CMOS stage is set by a tunable element.

FIG. 10 depicts an alternative texel 35 design. Here, the memristor potential divider R1/R2 is connected to the second CMOS stage. The memristors R1 and R2 set a bulk-terminal biasing point of transistor M3. The value of $V_{mid}$ at which the output current is maximised is thus not determined only by the size of transistors M3 and M4, as in the texel design of FIG. 3, but may be tuned by changing the resistive states of the memristors R1 and R2. The memristors thus set the value of the midpoint signal $V_{mid}$ at which the current drawn by the second CMOS stage is largest. The first CMOS stage serves to match the input range of the texel to the input range of the second CMOS stage. If the analogue input signal applied to the texel already is within a suitable input range, the first CMOS stage may be omitted from the texel 35 of FIG. 10. In FIG. 10, the memristors set a bulk terminal biasing point of the second CMOS stage. However, the skilled person would understand that the memristors could also be connected to the drain terminals of M3 and M4 (similar to the arrangement of the memristors at the drains of M1 and M2 in FIG. 3), or the source terminals of M3 and M4, to achieve a similar effect. Put another way, the memristors R1 and R2 may be connected in series to the second CMOS stage. Connecting the transistors to the source terminals of M3 and M4 allows control of the maximum current flowing through the second CMOS stage. Furthermore, the response speed of the second CMOS stage may be controlled by setting the RC of the second stage. Connecting the transistors to the drain terminals of M3 and M4 may allow independent tuning of the FWHM of the current output, thus controlling the selectivity of the texel 35 (i.e. the voltage range around the switch point at which a match is determined), by shifting the resistive values of the memristors. This may also be achieved by connecting only a single memristor between the drain terminals of M3 and M4 of the second CMOS stage. The skilled person would understand that these alternatives may be combined appropriately, for example such that memristors are connected both to the drain terminal and the source terminal of M3 and M4. The advantages of the different alternatives may thus be achieved simultaneously.

Figure 11:
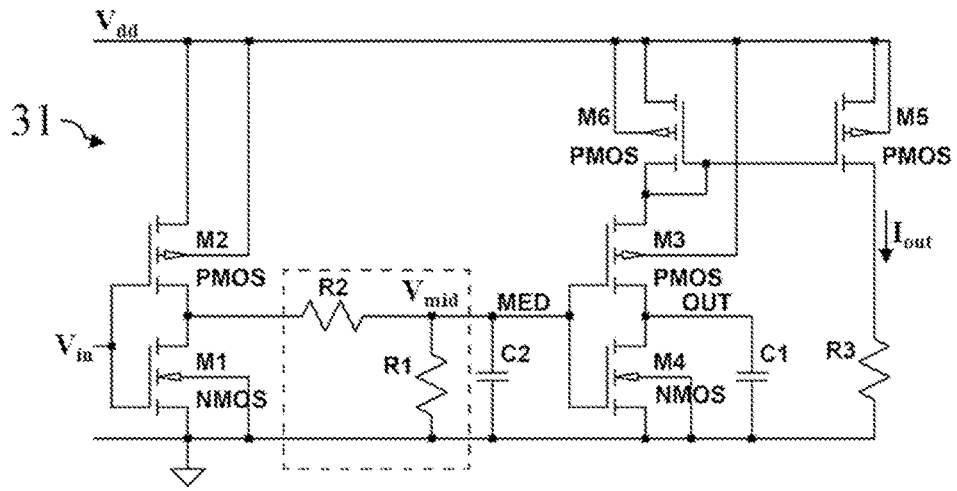
FIG. 11 shows another alternative embodiment of a texel circuit with a different tunable load arrangement.

FIG. 11 depicts a further alternative texel 35 design. In this variant, the memristors form a potential divider between the output of the first CMOS stage and the input of the second CMOS stage. The memristors are thus connected in between the first CMOS stage and the second CMOS stage, so as to map a first CMOS stage output to a midpoint signal $V_{mid}$. $V_{mid}$ is an input to the second CMOS stage. This variant may extend the input range of the texel 35 towards the ground level. This is achieved essentially by by-passing M1, such that the potential divider is dominated by the influence of M2, R1 and R2.

Figure 12:
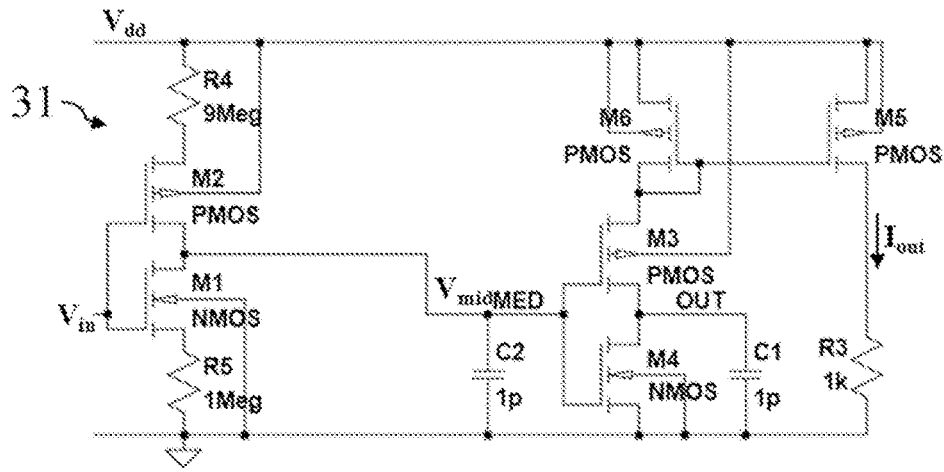
FIG. 12 shows another alternative embodiment of a texel circuit with a different tunable load arrangement.

FIG. 12 depicts a further alternative texel 35 design. In this variant, the memristors are connected to the source terminals of M1 and M2, so as to source-degenerate M1 and M2. This variant provides a completely new modality for shifting the input/output mapping of the first CMOS stage, thereby improving control over the reconfigurability of the texel 35. The variant may be combined with the texel 35 design of FIG. 3, such that four memristors are connected to the source terminal and the drain terminal of each of M1 and M2. This allows the power dissipation of the first CMOS stage to be reduced, in exchange for a slower response.

The various different texel 35 designs of FIGS. 3 and 8 to 12 serve to illustrate some of the many configurations according to which the present invention may be implemented. The skilled person would understand that features of these different texel 35 designs may be combined appropriately. For example, the input range setter of FIGS. 8 and 9 may be combined with any of the memristor arrangements of FIGS. 10 to 12. Furthermore, memristors may be connected to both the first and the second CMOS stage. The advantages described in conjunction with the variants of FIGS. 3 and 8 to 12 may thus be readily combined or achieved simultaneously. In each of the described variants, a tunable load other than a memristor may be used. Furthermore, the texels 35 may be provided with CMOS gates other than the CMOS inverter. In each of the different configurations, the current output of the texel 35 is maximised at a tunable switch point. Each of the texel 35 designs of FIGS. 3 and 8 to 12 may be implemented in the template rows 36 of the template matching module 30 of FIG. 6.

Figure 13:
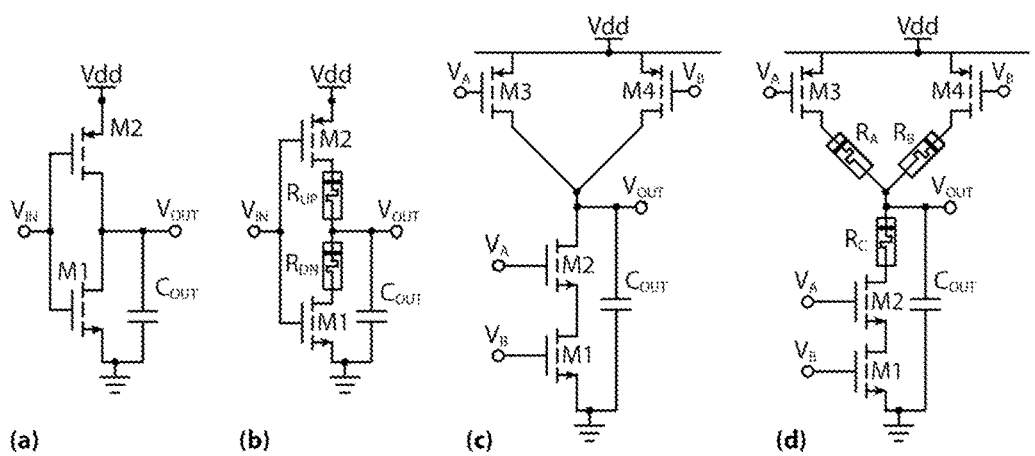
FIG. 13 depicts hardware implementations of conventional CMOS logic gates and their fuzzy logic counterparts in accordance with embodiments of the present invention.

The principle underlying the texel design may be taken further to provide hardware implementations of fuzzy logic, or to provide devices generally capable of mapping an input parameter to different membership functions. So far, fuzzy logic has never rested on a hardware foundation of simple and elegant components such as logic gates. This presents a road block in the use of fuzzy logic in practical applications. Past attempts to overcome this problem have mainly focused on fuzzy logic emulation through standard logic cells. The idea of combining memristor technology with CMOS logic, such as in the texel 35 design described above, opens up the possibility of circuit foundations for fuzzy logic computation relying on inherently fuzzy primitive components, or fuzzy logic gates. Example of two such fuzzy logic gates are shown in FIG. 13, along with their conventional CMOS logic counterparts.

FIG. 13a shows a conventional CMOS logic inverter. FIG. 13b shows a fuzzy logic inverter. FIG. 13c shows a conventional CMOS logic NAND gate. FIG. 13d shows a fuzzy logic NAND gate. The fuzzy logic inverter and the fuzzy logic NAND gate are examples of fuzzy logic gates.

The fuzzy logic inverter is an extension of the conventional CMOS logic inverter. The fuzzy logic inverter includes a CMOS logic inverter and two memristors, each of which is connected in series to one of the two transistors of the CMOS logic inverter. The fuzzy logic inverter essentially consists of two transistors and two memristors, such that the fuzzy logic inverter is essentially a four-component potential divider. The CMOS logic inverter consists of a p-MOS transistor and an n-MOS transistor. A first memristor is connected in series to the p-MOS transistor. A second memristor is connected in series to the n-MOS transistor. As such, a memristor is provided on each current path to the output node of the fuzzy logic inverter, such that every current path to and from the output node of the fuzzy logic gate is regulated by the presence of a memristor. The fuzzy logic inverter comprises an input node that receives an analogue input signal, and an output node that outputs an analogue output signal. The fuzzy logic inverter is thus operated differently from the conventional CMOS inverter, which receives a digital input signal ("high" or "low", "1" or "0") and outputs a digital output signal.

The fuzzy logic NAND gate is an extension of the conventional CMOS NAND gate. The fuzzy logic NAND gate includes a CMOS NAND gate and three memristors. The CMOS NAND gate includes two "pull-up" transistors connected in parallel between a voltage source $V_{dd}$ and an output node. The CMOS NAND gate further includes two "pull-down" transistors connected in series between ground and an output node. In the fuzzy logic NAND gate, a respective memristor is connected in series to each of the two "pull-up" transistors. A third memristor is connected in series to the two serially connected "pull-down" transistors. As such, a memristor is provided on each current path to the output node of the fuzzy logic inverter, such that every current path to and from the output node of the fuzzy logic gate is regulated by the presence of a memristor. The fuzzy logic NAND gate is a three-way potential divider consisting essentially of four transistors and three memristors. The fuzzy logic NAND gate comprises two input nodes that receive two analogue input signals, and an output node that outputs an analogue output signal. The fuzzy logic NAND gate is thus operated differently from the conventional CMOS NAND gate, which receives a digital input signal and outputs a digital output signal.

The memristor is an example of a tunable load, and may for example be a metal-oxide memristive device. The skilled person would understand that the fuzzy logic gate may be implemented with any other tunable load or tunable resistive element. As such, any tunable load may be used instead of a memristor. The skilled person would further understand that any of the memristors of the fuzzy logic inverter and the fuzzy logic NAND gate may be a "zero resistance memristor", i.e. a memristor with a resistance set to zero. Thus some of the memristors depicted in FIGS. 13b and 13d may be omitted. A fuzzy logic gate may comprise a single memristor that is provided on a current path to or from an output node. A plurality of memristors may be provided on some of a plurality of currents paths to or from an output node. For example, the fuzzy logic inverter of FIG. 13b may include only $R_{UP}$ or only $R_{DN}$. The fuzzy logic NAND gate of FIG. 13d may include only $R_A$, only $R_B$, only $R_C$, or any combination thereof. A single such memristor allows reconfigurability of a fuzzy logic gate, and enables mapping of intermediate analogue input signals to intermediate analogue output signals. Such reconfigurability and input/output mapping is described in more detail in the following.

Figure 14:
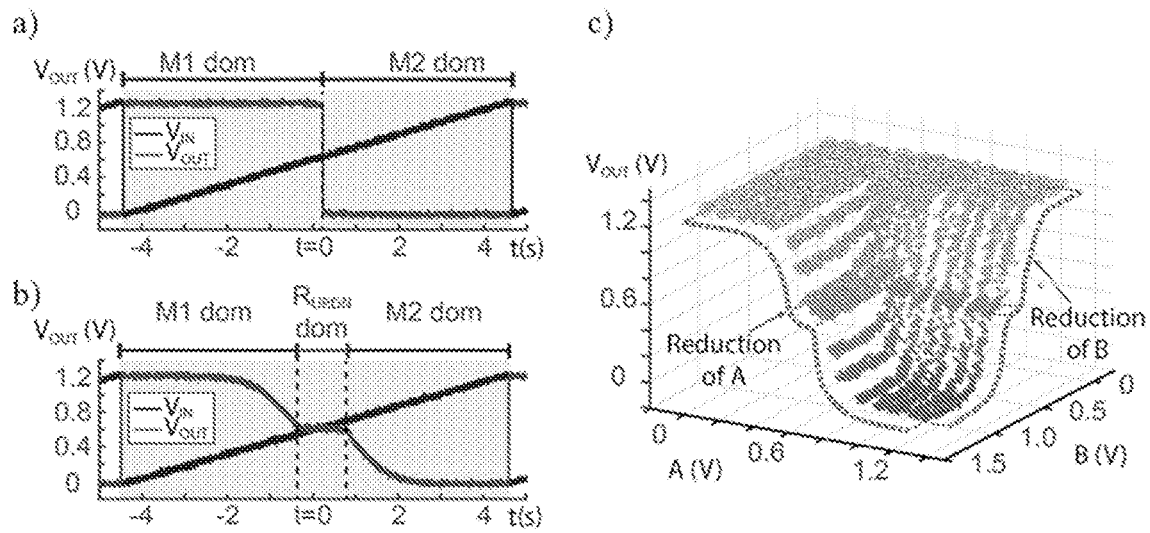
FIG. 14 depicts examples of operation of the conventional CMOS inverter, the fuzzy logic inverter, and the fuzzy logic NAND gate of FIG. 13.

The operating principle of the fuzzy logic gates of FIG. 13 is illustrated in FIG. 14. FIG. 14a shows an example of a measured transfer characteristic of the conventional CMOS inverter of FIG. 13a. FIG. 14b shows an example of a measured transfer characteristic of the fuzzy logic inverter of FIG. 13b. As shown in FIG. 14a, the output of a conventional CMOS inverter is high when a voltage below a threshold (for example about 0.6V) is applied, and low when a voltage above the threshold is applied. The output is determined fully by the switching behaviour of the transistors of the CMOS inverter. By contrast, as shown in FIG. 14b, the output of the fuzzy logic inverter is dominated either by the states of the transistors (at relatively low and high input voltages) or by the memristors (at intermediate analogue input voltages). Which component of the fuzzy logic inverter dominates its output behaviour depends on the precise level of the analogue input voltage. At each edge of the input voltage range, i.e. when a low or high analogue input voltage is applied to the fuzzy logic inverter, one of the transistors of the four-component potential divider that forms the fuzzy logic inverter exhibits an impedance that dominates the four-component potential divider. Standard Boolean inverter operation (i.e. digital inverter operation, or CMOS logic inverter operation) is obtained for low and high input voltages. However, at intermediate analogue input voltages both transistors of the fuzzy logic inverter are open, such that the two memristors dominate the four-component potential divider. As shown in FIG. 4b, a plateau arises in the transfer characteristic at intermediate analogue input values. The plateau may be an intermediate output. The memristors may set the voltage level or voltage value of the plateau or intermediate output. The voltage level or voltage value may be substantially constant for a range of analogue input signals. The memristors may set the width of the plateau, so as to set the range of analogue input signal values which, when applied to the fuzzy logic gate, result in the intermediate output or plateau. Control of the resistive states of the memristors allows control of this intermediate output voltage level, such that the memristors set or store an intermediate output voltage level of the fuzzy logic inverter.

FIG. 14c shows an example of the measured transfer characteristic from two analogue input signals (A and B) to the one analogue output signal of the fuzzy logic NAND gate of FIG. 13d. The transfer characteristic is defined by a "fuzzy function surface". The shape of the fuzzy function surface can be controlled by shifting the resistive state of the memristors. The fuzzy function that maps an input, or a set of inputs A and B, to an output, can be controlled by the memristors, such that the memristors control the output behaviour of the fuzzy logic gate. The fuzzy function surface, and as such the output behaviour or output mapping, can be controlled orthogonally by varying $R_A$ and $R_B$ (and keeping $R_C$ constant). The shape of the fuzzy function surface may be controlled by varying $R_C$. At the same time, the inherent NAND nature, i.e. the Boolean NAND logic, of the fuzzy logic NAND gate is retained. When input A is fully "on" (at digital "1"), i.e. a high analogue input voltage is applied input node A, the fuzzy logic NAND gate behaves as a fuzzy logic inverter with an input B. This is referred to as the "fuzzy logic inverter reduction of B". The output behaviour of the fuzzy logic inverter reduction of B is determined by the resistive states of memristors M1 and M4. Similarly, when input B is fully on, the fuzzy logic NAND gate behaves as a fuzzy logic inverter with an input A, i.e. is reduced to the fuzzy logic inverter reduction of A. If either of inputs A or B is fully "off", (at digital "0"), i.e. a low analogue input voltage is applied to any of input node A or B, the output of the fuzzy logic NAND gate is "high".

The fuzzy logic inverter and the fuzzy logic NAND gate are two examples of fuzzy logic gates. The skilled person would understand that other fuzzy logic gates may be implemented by extending other conventional CMOS gates, such as NOR, AND, OR, or XOR CMOS gates. Any CMOS gate can be combined with memristors such that a memristor is provided on each current path to an output node. This allows control of the fuzzy function, input/output mapping, or output behaviour of any such fuzzy logic gate.

The memristors thus set or control the output behaviour, or input/output mapping, or fuzzy function, or fuzzy function mapping of the fuzzy logic gate. The inherent CMOS logic of the CMOS logic gate of the fuzzy logic gate is retained. If a logic input (i.e. "high" or "low") is applied to the fuzzy logic gate, it outputs a logic output that depends on the underlying logic function of the CMOS logic gate of the fuzzy logic gate. The resistive states of the memristors determine the fuzzy function that maps an analogue input signal to an analogue output signal. The analogue input signal and/or the analogue output signal may have a voltage value that is in between, or intermediate to, a logic input of "high" or "low", or may be at the "high" or "low" voltage level.

A method of using a fuzzy logic gate may include setting the resistive state of each of the plurality of tunable loads. The resistive states of the tunable loads define the fuzzy function, or input/output mapping, of the fuzzy logic gate. An analogue input signal may be applied to the one or more input nodes of the fuzzy logic gate. The fuzzy logic gate may map the applied analogue input signal to an analogue output signal, in accordance with the fuzzy function set by the tunable loads. The analogue output signal may be outputted by an output node.

To be commercially competitive vis-a-vis standard Complementary Metal-Oxide Silicon (CMOS) technology the fuzzy logic gates must be both read in an extremely simple and efficient manner and capable of being modularly chained. This means that the output of a fuzzy gate has to be a suitable input for the next one. Since the proposed fuzzy gates use analogue voltages as both inputs and outputs this compatibility is ensured. However, an elegant interface to connect a fuzzy logic gate to standard CMOS and neuro-inspired electronics is also desirable. A connection of a standard CMOS logic gate to the output of a fuzzy logic gate takes advantage of the fact that a read out inverter may be characterised by a switch point voltage, i.e. an input voltage level at which both transistors are simultaneously ON and the inverter output voltage is close to the middle of the supply. Any input voltages above this switch point may be defuzzified to a digital 0 whilst values below this switch point will defuzzify to digital 1. Defuzzifying means conversion of the analogue output signal of a fuzzy logic gate to a digital signal that may be applied to a CMOS logic gate. A small range of input values close to the switch point, however, may lead to an unclear defuzzification that may stochastically result in either digital 1 or 0 values. Changing the resistive states of the memristors of a fuzzy logic gate can alter the range of analogue input signals which lies above/below the read out circuit switch point. The defuzzification mapping from fuzzy gate outputs to defuzzifier (or read-out circuit) output can thus be changed. The switch point of the read out circuit is determined by the aspect ratio (W/L) of its constituent transistors and is a design parameter. Connecting a fuzzy logic gate to the output of a standard CMOS gate requires no converter or read-out circuit, as any Boolean input level (i.e. logic "1" or "0") is automatically a valid fuzzy logic gate input.

Figure 15:
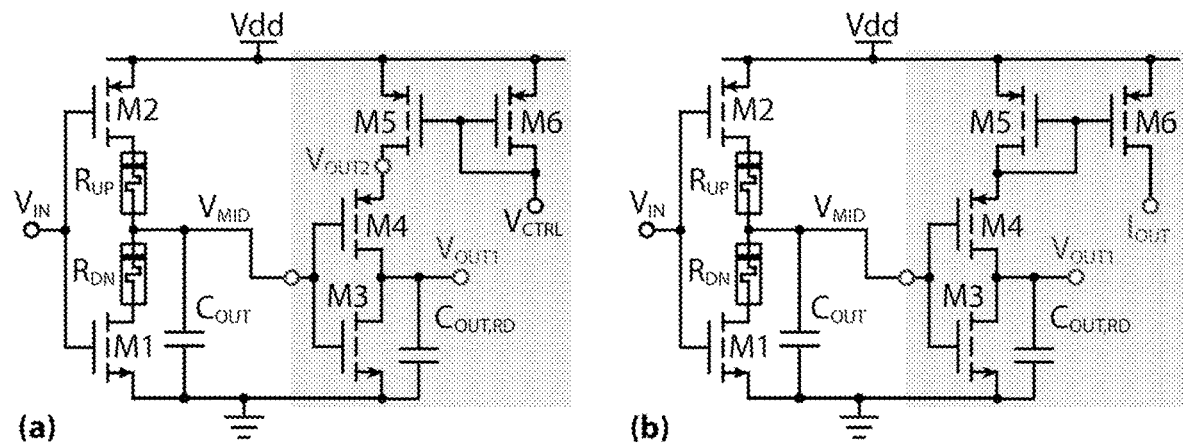
FIG. 15 depicts read-out circuitry for reading out the fuzzy logic state of a fuzzy logic inverter.

An example of a read-out circuit for reading out the output of a fuzzy logic inverter in a simple and efficient manner, such that it can be applied to a CMOS logic gate, is shown in FIG. 15. The combination of the fuzzy logic inverter and the read-out circuit is equivalent to the texel design of FIG. 3. The operating principle of the circuit of FIG. 15 thus corresponds to the operating principle underlying the texel design. The read-out circuit of FIG. 15a includes two output nodes $V_{out1}$ and $V_{out2}$. $V_{out1}$ is used to defuzzify the output of the fuzzy logic inverter to digital 1 or 0 based on whether $V_{in}$ is above or below some threshold $V_{th}$. $V_{out2}$ indicates whether $V_{in}$ is close or far from $V_{th}$. In the alternative read-out circuit of FIG. 15b, $I_{out}$ is used instead of $V_{out2}$ to determine whether $V_{in}$ is close or far from $V_{th}$. An analogue output signal of the fuzzy logic gate may be thus be defuzzified to generate two digital bits. One bit may indicate whether the analogue output signal is above or below a threshold $V_{th}$. The other bit may indicate whether the analogue output signal is close or far from a threshold $V_{th}$.

Figure 16:
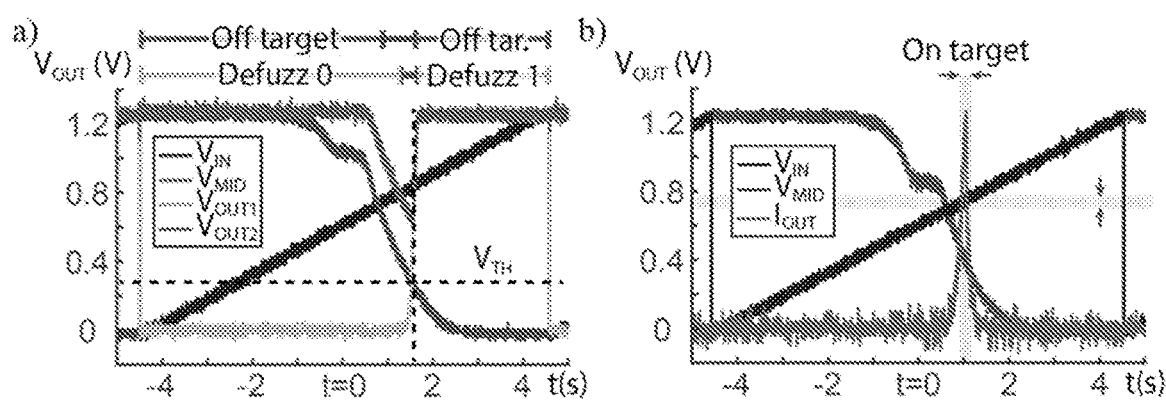
FIG. 16 illustrates measurements of the read-out circuitry of FIG. 15.

FIGS. 16a and 16b show the respective transfer characteristics of the fuzzy logic inverters and read out circuits of FIGS. 15a and 15b. As shown in FIG. 16a, the fuzzy logic inverter output ($V_{mid}$) is successfully defuzzified to logic "1" or "0" for most of the fuzzy logic inverter input range ($V_{in}$). $V_{out2}$ exhibits a dip only when $V_{mid}$ is close to fixed voltage value $V_{th}$, directly indicating whether $V_{in}$ is on-target (i.e. close to Vth) or off-target. $V_{out2}$ provides an indication of when the output of the fuzzy logic inverter is at an intermediate level (rather than "high" or "low"). As shown in FIG. 16b, the alternative measured parameter $I_{out}$ peaks within a narrow range of input voltages when $V_{in}$ is at an intermediate level. The operation of the read out circuit is described in more detail above, in relation to the texel of FIG. 3 and its transfer characteristic of FIG. 4.

The mirror supply (M6) of FIG. 15a is not strictly necessary for the defuzzification strategy described above, but offers an interesting alternative approach. The principle of operation relies on the observation that the read out inverter M3/M4 conducts most current at the switch point voltage, when both its transistors are maximally ON simultaneously. The mirror supply exploits this by attempting to force a reference current into the inverter. The reference current is set in such way that only when the inverter is sufficiently close to its maximally conducting state, the voltage on node $V_{out2}$ in FIG. 15a is driven to a digital "0". The circuit therefore offers a way of performing defuzzification by mapping a very specific fuzzy gate output level to a digital "0". Modifying the magnitude of the reference current will tune the fuzzy gate output level range for which defuzzification using this strategy will return a digital "0". Slightly modifying the mirror supply leads to the read out circuit of FIG. 15b, which mirrors the read-out inverter current directly to a circuit terminal. Providing the defuzzification output in the form of a current allows for easy summation of defuzzification results from many fuzzy gates. The resulting, summed current can then easily be provided as input to an integrate and fire neuron as used in neuromorphic engineering.

The input/output mapping, or fuzzy function, of a fuzzy logic gate may be controlled by changing the resistive states of the memristors of the fuzzy logic gate, so as to reconfigure a fuzzy logic gate. Reconfiguring a fuzzy gate means changing the shape of the mapping by modifying the resistive states of its memristors. Each memristors constitutes a design degree of freedom. This gives a fuzzy inverter two degrees of reconfigurability freedom and a NAND gate three degrees. The span of each of these degrees of freedom will be bound by the range of resistive state values that the corresponding memristor can attain. The design of the non-memristive part of the system, and in particular the settings of the key design parameters of transistor aspect ratio W/L and power supply voltage Vdd, may be tailored so as to optimize gate functionality given the chosen memristor technology's inherent resistive state ranges.

Figure 17:
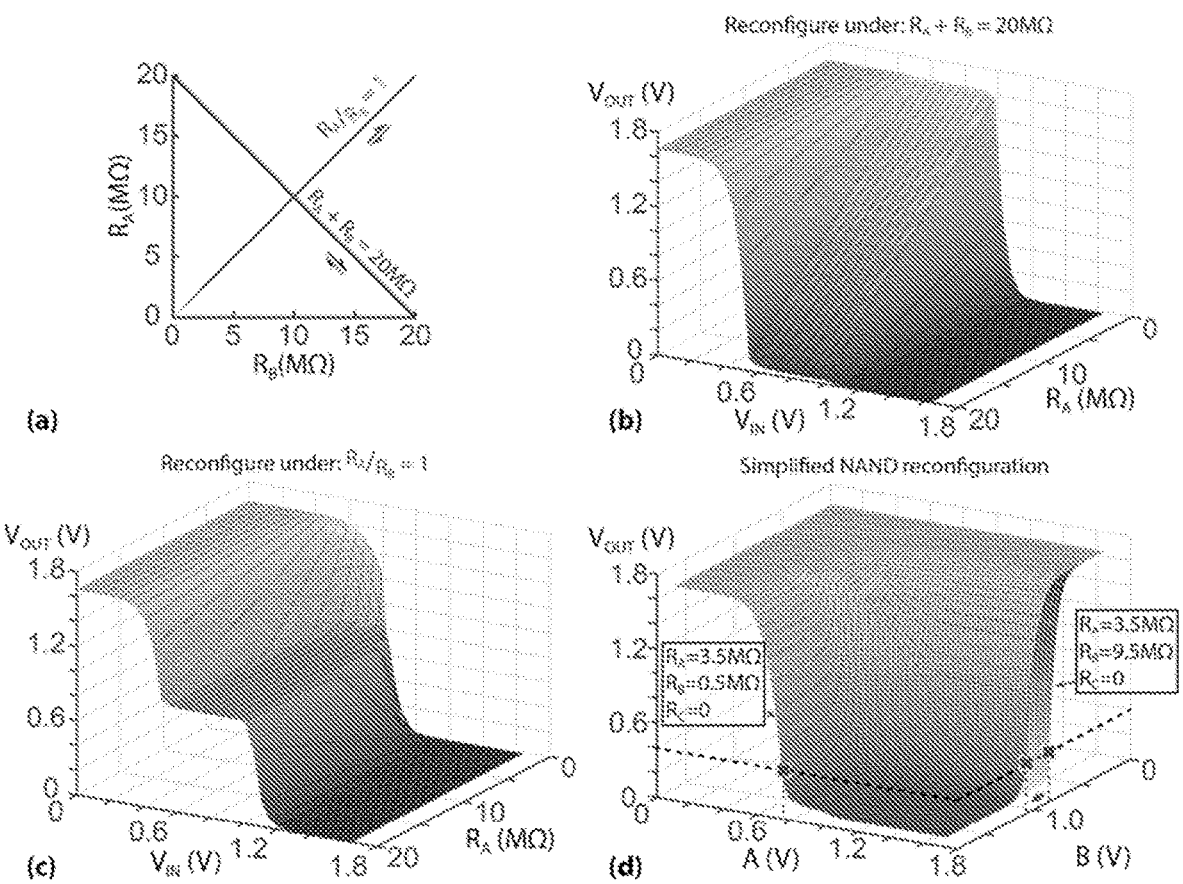
FIG. 17 illustrates examples of the dependence of the fuzzy function of the fuzzy logic inverter and fuzzy logic NAND gate on the resistive states of their memristors.

FIG. 17 shows an example of reconfigurability modalities in fuzzy gates. FIG. 17a shows how the resistive states of two memristors in a fuzzy logic inverter may be changed so as to keep their sum (negatively sloped line) or ratio (positively sloped line). The two control modalities exert orthogonal effects on the plateau in the inverter's transfer characteristic. Changes to the resistive states of memristors thus allow targeted control of the fuzzy logic inverter's transfer characteristics. Altering values of the two memristors Ra and Rb simultaneously under the constraint Ra/Rb=1 (ratio-fixed modality), or alternatively under the constraint Ra+Rb=c (sum-fixed modality) where c is a constant, provides two useful fuzzy inverter mapping control modalities. FIG. 17b shows an example of a fuzzy logic inverter transfer characteristics under a constant sum of memristor resistivities. The constant sum modality allows independent control of a transfer characteristic's plateau height, i.e. of the intermediate voltage level. The memristors may control the voltage value of the intermediate voltage. FIG. 17c shows an example of a fuzzy logic inverter transfer characteristics under a constant ratio of memristor resistivities. The constant ratio modality allows for independent control of the plateau's width, i.e. the range of analogue input voltages which result in the intermediate level output. The memristors may control the range of analogue input signals that result in the fuzzy logic gate outputting the intermediate voltage. The fuzzy logic inverter is thus freely reconfigurable, allowing targeted control of the fuzzy function of the fuzzy logic inverter using the memristors.

The principle underlying the reconfigurability of a fuzzy logic inverter can be extended to a fuzzy logic NAND gate, due to the multiplicative interaction between the NAND gate's two fuzzy inverter reductions described above. An exemplary transfer characteristic of a simplified fuzzy logic NAND gate of FIG. 13d is shown in FIG. 17d. Rc is set to 0, Ra is maintained at a fixed value, and Rb is tuned within a range from 0.5 MΩ to 9.5 MΩ. If a defuzzification threshold $V_{th}$ is set at 0.4V (thick dotted line) the voltage level of input B at which the gate switches between defuzzified output "1" and "0" shifts when Rb is tuned. The corresponding voltage level for input A remains unchanged. The crosses on the graph of FIG. 17d mark the fuzzy logic NAND gate's switching points with respect to input A (if input B is "high") and with respect to input B (if input A is "high"). As such, the partitioning of the input voltage ranges of input A and input B into defuzzified "0" and "1" values under threshold-based defuzzification can be directly and independently controlled by the corresponding memristors Ra and Rb. Changing Rc would affect both fuzzy logic inverter reductions (i.e. of A and of B) of the fuzzy logic NAND gate simultaneously, such that the orthogonal plateaus or intermediate voltages of the transfer characteristic of the fuzzy logic NAND gate (see FIG. 14c) can be controlled at the same time by varying the resistivity of the single memristor Rc. Independent control of the plateau in the transfer characteristic of the fuzzy logic inverter reduction of A and the plateau in the transfer characteristic of the fuzzy logic inverter reduction of B is not enabled by memristor Rc.

Additional complexity is introduced by the fact that the fuzzy logic NAND gate contains three memristors. This number is insufficient for controlling the two reduced inverter transfer characteristics completely independently (i.e. controlling both sum and ratio of both reduced inverters). In applications where the fuzzy logic serves the purpose of encoding Bernoulli distributions this degree of control may be sufficient. Alternatively, a more generally applicable way of circumventing the reduced degree of freedom issue in the fuzzy logic NAND gate is to use two fuzzy logic inverters and NANDing their outputs.

A crucial aspect of a fuzzy logic gate is its power efficiency. This is best illustrated by inspecting the energy dissipation of an ideal digital inverter and its fuzzy counterpart. The energy required to flip a standard inverter's state $E_{flip}$ depends on the output capacitance $C_{out}$ and the power supply voltage $V_{DD}$ and is given by the formula:

$$E_{flip} = C_{out} \frac{VDD^2}{2} \tag{1}$$

Figure 18:
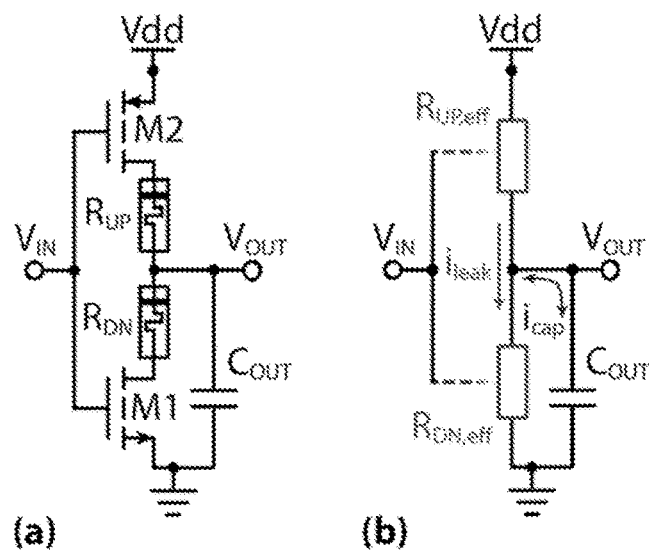
FIG. 18 depicts a simplified version of the fuzzy logic inverter that allows power estimation analysis.

In order to investigate power dissipation in a fuzzy, reconfigurable logic inverter, the simplified circuit of FIG. 18 is considered. As shown in FIG. 18b, both transistors and memristors are treated as linear resistors that remain constant for any fixed input $V_{in}$. The objective is to compute the energy cost involved in moving the output voltage of the fuzzy inverter from its initial state $V_{OUT,1}$ under input voltage $V_{IN,1}$ to a new state $V_{OUT,2}$, as imposed by a new input voltage $V_{IN,2}$. The current leaving the power supply $I_{VDD}$ is given by Kirchhoff's laws:

$$I_{VDD}(t) = \frac{VDD - V_{OUT}(t)}{R_1} = \frac{VDD(1 - Q_{div}) - \Delta V_{OUT} e^{-t/R_\| C_{oUt}}}{R_1} \tag{2}$$

where $Q_{div} = \frac{R_2}{R_1 + R_2}$, $\Delta V_{OUT} = V_{OUT,2} - V_{OUT,1}$, $R_\| = \frac{R_1 R_2}{R_1 + R_2}$ and $R_1$, $R_2$ the equivalent memristor-transistor resistances at $V_{IN}=V_{IN,2}$.

Integrating $I_{VDD}(t)$ over time for an interval of time $t_{set} \equiv lR_\| C_{out}$ where the system is considered to have satisfactorily converged to its equilibrium value ($V_{OUT,final} \approx V_{OUT,2}$) a total charge usage $Q_{tot}$ of is obtained as:

$$Q_{tot}(t_{set}) = \int_{t=0}^{\tau=t_{set}} I_{VDD} dT = t_{set} \frac{VDD}{R_1 + R_2} + C_{out} \Delta V_{OUT} Q_{div}(1 - e^l) \quad (3)$$

The first term is a constant leakage down the inverter (leakage term) and depends on the total inverter impedance and the acceptable computation time. The second term includes the ideal charge transfer required to change the voltage at the output node by $\Delta V_{OUT}$, $Q_{ideal} = C_{out}\Delta V_{OUT}$ (charging term). The $Q_{div}$ in the charging term is best understood as the extent to which the $C_{out}$ capacitor current flows into the power supply or the ground. With $Q_{div}$ close to zero $C_{out}$ charges/discharges preferentially into the ground whilst for $Q_{div}$ close to unity the supply is preferred. The charging term may be positive or negative depending on the relationship between $V_{OUT,2}$ and $V_{OUT,1}$. Without loss of generality the case where $V_{IN,1} > V_{IN,2}$, $V_{OUT,1} < V_{OUT,2}$ and the charging term is positive is considered.

By translating charge into energy dissipation an upper bound can be determined by rounding $Q_{div}$ to unity and considering that every charge q leaving the power supply will (eventually) reach ground dissipating qVDD energy, to obtain:

$$E(t) < Q_{tot}(t_{set})VDD < t_{set}\frac{VDD^2}{R_1 + R_2} + VDDC_{out}\Delta V_{OUT}(1 - e^l) \quad (4)$$

This highlights three points: First, the fuzzy logic inverter has an (upper bound) energy dissipation given by a charging term that reduces to the standard inverter (within factor of 2) dissipation for $\Delta V_{OUT} = VDD$ and $t \to \infty$ plus a leakage term. Second, the leakage term depends on the in-operando impedance of the inverter whilst the charging term only depends on output capacitance. Third, longer waiting times lead to more accurate computations ($V_{OUT}(t_{set})$ closer to the ideal equilibrium value), but incur a larger leakage energy penalty. Finally, it can be shown that Equation (3) can also be expressed as $$Q_{tot}(t_{set}) = lC_{out}VDDQ_{div}(1-Q_{div}) + C_{out}\Delta V_{OUT}Q_{div}(1-e^l) \quad (5)$$

The fact that charge consumption is expressible as function of $Q_{div}$ shows that the absolute values of $R_1$ and $R_2$ are only significant for setting the temporal dynamics (via the $R_\|C_{out}$ constant—the units of l); charge dissipation depends only on their relationship. This is significant as it shows that fuzzy gate speed can be traded off against memristor resistive state to some extent. Equation (5) also reveals that for $\Delta V_{OUT} \approx VDD$ and suitable $Q_{div}$ the leakage and charging terms will be broadly comparable even for l values sufficiently long to allow the system to converge to equilibrium (e.g. within 2% for l=4).

In conclusion, the calculations above suggest that analogue, fuzzy computation is achievable at an energy price close to digital. Moreover, in practical electronics input voltages can only cross from one level to the other within a finite interval of time. This causes even the standard Boolean inverter to spend some time with both its transistors ON when the input voltage is between digital 1 and 0 with an associated energy cost ignored by Equation (1).

There is thus provided a hardware implementation of fuzzy logic, that allows highly controllable reconfiguration of the fuzzy function or input/output mapping. The fuzzy logic gates according to the present invention exhibit low power dissipation and a small area footprint.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

It is specifically intended that the present invention not be limited to the embodiments and illustrations contained herein and the claims should be understood to include modified forms of those embodiments including portions of the embodiments and combinations of elements of different embodiments as come within the scope of the following claims. It is explicitly stated that all value ranges or indications of groups of entities disclose every possible intermediate value or intermediate entity for the purpose of original disclosure as well as for the purpose of restricting the claimed invention, in particular as limits of value ranges.

REFERENCES

[1] I. H. Stevenson and K. P. Kording, "How advances in neural recording affect data analysis." Nature neurosc., vol. 14, no. 2, pp. 139-142, 2011.

[2] E. M. Maynard, C. T. Nordhausen, and R. A. Normann, "The Utah intracortical electrode array: A recording structure for potential brain-computer interfaces," Electroencephalography and Clinical Neurophysiology, vol. 102, no. 3, pp. 228-239, 1997.

[3] D. Y. Barsakcioglu et al., "An Analogue Front-End Model for Developing Neural Spike Sorting Systems," IEEE Transactions on Biomedical Circuits and Systems, vol. 8, no. 2, pp. 216-227, April 2014.

[4] A. Rodriguez-Perez et al., "A low-power programmable neural spike detection channel with embedded calibration and data compression," in IEEE Transactions on Biomedical Circuits and Systems, vol. 6, no. 2, April 2012, pp. 87-100.

[5] S. E. Paraskevopoulou and T. G. Constandinou, "A sub-1 W neural spike-peak detection and spike-count rate encoding circuit," in 2011 IEEE Biomedical Circuits and Systems Conference (BioCAS). IEEE, November 2011, pp. 29-32.

[6] A. Berenyi et al., "Large-scale, high-density (up to 512 channels) recording of local circuits in behaving animals." Journal of neurophysiology, vol. 111, no. 5, pp. 1132-49, March 2014.

[7] R. Q. Quiroga, Z. Nadasdy, and Y. Ben-Shaul, "Unsupervised Spike Detection and Sorting with Wavelets and Superparamagnetic Clustering," Neural Computation, vol. 16, no. 8, pp. 1661-1687, August 2004.

[8] S. Gibson et al., "An efficiency comparison of analog and digital spike detection," in 2009 4th International IEEE/EMBS Conference on Neural Engineering. IEEE, April 2009, pp. 423-428.

[9] M. S. Lewicki, "A review of methods for spike sorting: the detection and classification of neural action potentials, July 2009.

[10] J. Navaj as et al., "Minimum requirements for accurate and efficient real-time on chip spike sorting," Journal of Neuroscience Methods, vol. 230, pp. 51-64, 2014.

[11] M. Chae et al., "A 128-channel 6 mW wireless neural recording IC with on-the-fly spike sorting and UWB Transmitter," in Digest of Technical Papers—IEEE International Solid-State Circuits Conference, vol. 51. IEEE, 2008, pp. 146-603.

The invention claimed is:

1. A tunable complementary metal oxide semiconductor (CMOS) circuit comprising
    a CMOS element configured to receive an analogue input signal, and
    a tunable load connected to the CMOS element and configured to set a switch point of the CMOS element,
    wherein the CMOS element is configured to output an output current, the output current being largest when the analogue input signal is equal to the switch point.

2. The tunable CMOS circuit of claim 1, wherein the tunable load comprises one or more memristors.

3. The tunable CMOS circuit of claim 1, wherein:
    the CMOS element comprises a first CMOS stage and a second CMOS stage,
    the first CMOS stage is configured to receive the analogue input,
    the output of the first CMOS stage is connected to the input of the second CMOS stage, and
    the second CMOS stage is configured to draw a current that is largest when the analogue input signal is equal to the switch point.

4. The tunable CMOS circuit of claim 3, wherein:
    the first CMOS stage comprises a CMOS inverter, and/or the second CMOS stage comprises a CMOS inverter.

5. The tunable CMOS circuit of claim 3, wherein:
    the CMOS element comprises an output stage configured to output the output current, and
    the output stage is configured to output an output current that is proportional to the current drawn by the second CMOS stage, optionally wherein the output stage comprises a current mirror.

6. The tunable CMOS circuit of claim 3, wherein:
    the first CMOS stage is configured to output a midpoint signal,
    the second CMOS stage is configured to draw a current that is largest when the midpoint signal is at a predetermined fixed value, and
    the tunable load is connected to the first CMOS stage such that the first CMOS stage outputs a midpoint signal equal to the predetermined fixed value when the analogue input signal is equal to the switch point set by the tunable load.

7. The tunable CMOS circuit of claim 3, wherein:
    the first CMOS stage is configured to output a midpoint signal, and
    the tunable load is connected to the second CMOS stage so as to set the value of the midpoint signal at which the current drawn by the second CMOS stage is largest.

8. The tunable CMOS circuit of claim 7, wherein the tunable load is connected in series to the second CMOS stage.

9. The tunable CMOS circuit of claim 1, wherein the CMOS element consists of six transistors and two memristors.

10. The tunable CMOS circuit of claim 3, further comprising an input range setter connected to the first CMOS stage, the input range setter being configured to match an input signal range of the first CMOS stage to an input signal range of the second CMOS stage.

11. A method of using the tunable complementary metal oxide semiconductor (CMOS) circuit of claim 1, the method comprising:
    programming the tunable load to set the switch point of the tunable CMOS circuit,
    applying an analogue signal to the tunable CMOS circuit, and
    measuring the output current of the tunable CMOS circuit.

* * * * *